US012784858B2

(12) United States Patent
Khwa et al.

(10) Patent No.: US 12,784,858 B2
(45) Date of Patent: Nov. 3, 2026

(54) SYSTEM, MEMORY DEVICE AND METHOD

(71) Applicants: TAIWAN SEMICONDUCTOR MANUFACTURING COMPANY, LTD., Hsinchu (TW); NATIONAL TSING HUA UNIVERSITY, Hsinchu City (TW)

(72) Inventors: Win-San Khwa, Taipei City (TW); Hung-Hsi Hsu, Hsinchu City (TW); Jui-Jen Wu, Hsinchu (TW); Meng-Fan Chang, Taichung City (TW)

(73) Assignees: TAIWAN SEMICONDUCTOR MANUFACTURING COMPANY, LTD., Hsinchu (TW); NATIONAL TSING HUA UNIVERSITY, Hsinchu City (TW)

( * ) Notice: Subject to any disclaimer, the term of this patent is extended or adjusted under 35 U.S.C. 154(b) by 175 days.

(21) Appl. No.: 18/762,155

(22) Filed: Jul. 2, 2024

(65) Prior Publication Data

US 2025/0285701 A1 Sep. 11, 2025

Related U.S. Application Data

(60) Provisional application No. 63/563,810, filed on Mar. 11, 2024.

(51) Int. Cl.
*G11C 29/14* (2006.01)
*G11C 29/18* (2006.01)

(52) U.S. Cl.
CPC .............. *G11C 29/14* (2013.01); *G11C 29/18* (2013.01); *G11C 2029/1802* (2013.01)

(58) Field of Classification Search
CPC . G11C 29/14; G11C 29/18; G11C 2029/1802; G11C 13/0026; G11C 11/54;
(Continued)

(56) References Cited

U.S. PATENT DOCUMENTS

| | | | | |
|---|---|---|---|---|
| 2021/0182077 | A1* | 6/2021 | Chen | G06F 9/445 |
| 2022/0027723 | A1 | 1/2022 | Kolter | |

(Continued)

FOREIGN PATENT DOCUMENTS

| | | | |
|---|---|---|---|
| TW | I792247 | B | 2/2023 |
| TW | 202341150 | A | 10/2023 |

OTHER PUBLICATIONS

Xin, S. et al., "A Twin-8T SRAM Computation-In-Memory Macro for Multiple-Bit CNN-Based Machine Learning," IEEE International Solid-State Circuits Conference (ISSCC), pp. 396-397 (2019).

(Continued)

*Primary Examiner* — Mohammed A Bashar
(74) *Attorney, Agent, or Firm* — Maschoff Brennan

(57) ABSTRACT

A memory device is provided, comprising an encoder circuit, a memory array and an accumulator circuit. The encoder circuit converts a first bit of each of weights into a sign bit to generate encoded weights according to flag data. The memory array comprises memory cells. The memory cells arranged in a same column store bits, of the encoded weights and the flag data, having the same index number. The memory array performs a compute-in-memory (CIM) operation to the encoded weights and inputs to generate a plurality of CIM results. Each of the plurality of CIM results corresponds to a column of the memory array. The accumulator circuit decodes the CIM results according to the flag data to generate decoded CIM results.

20 Claims, 12 Drawing Sheets

(58) Field of Classification Search
CPC ............... G11C 13/0028; G06F 7/5443; G06F 15/7821
See application file for complete search history.

(56) References Cited

U.S. PATENT DOCUMENTS

| | | | | |
|---|---|---|---|---|
| 2022/0101914 | A1* | 3/2022 | Dreesen .................. | G06G 7/16 |
| 2022/0398439 | A1 | 12/2022 | Zhang | |

OTHER PUBLICATIONS

Xue, C.-X. et al., "A 22nm 4Mb 8b-Precision ReRAM Computing-in-Memory Macro with 11.91 to 195.7TOPS/W for Tiny AI Edge Devices," IEEE International Solid-State Circuits Conference (ISSCC), pp. 246-247 (2021).
Wen, T.-H. et al., "A 22nm 16Mb Floating-Point ReRAM Compute-in-Memory Macro with 31.2TFLOPS/W for AI Edge Devices," IEEE International Solid-State Circuits Conference (ISSCC), pp. 580-581 (2024).

* cited by examiner

300

| | two's complement | | | | | dual sign bit (M=1) | | | | |
|---|---|---|---|---|---|---|---|---|---|---|
| numerical value | place value | | | | # of zeros | place value | | | | # of zeros |
| | $-2^3$ | $2^2$ | $2^1$ | $2^0$ | | $-2^3$ | $2^2$ | $-2^1$ | $2^0$ | |
| -8 | 1 | 0 | 0 | 0 | 3 | 1 | 0 | 0 | 0 | 3 |
| -7 | 1 | 0 | 0 | 1 | 2 | 1 | 0 | 0 | 1 | 2 |
| -6 | 1 | 0 | 1 | 0 | 2 | 1 | 1 | 1 | 0 | 1 |
| -5 | 1 | 0 | 1 | 1 | 1 | 1 | 1 | 1 | 1 | 0 |
| -4 | 1 | 1 | 0 | 0 | 2 | 1 | 1 | 0 | 0 | 2 |
| -3 | 1 | 1 | 0 | 1 | 1 | 1 | 1 | 0 | 1 | 1 |
| -2 | 1 | 1 | 1 | 0 | 1 | 0 | 0 | 1 | 0 | 3 |
| -1 | 1 | 1 | 1 | 1 | 0 | 0 | 0 | 1 | 1 | 3 |
| 0 | 0 | 0 | 0 | 0 | 5 | 0 | 0 | 0 | 0 | 4 |
| 1 | 0 | 0 | 0 | 1 | 3 | 0 | 0 | 0 | 1 | 3 |
| 2 | 0 | 0 | 1 | 0 | 3 | 0 | 1 | 1 | 0 | 2 |
| 3 | 0 | 0 | 1 | 1 | 2 | 0 | 1 | 1 | 1 | 1 |
| 4 | 0 | 1 | 0 | 0 | 3 | 0 | 1 | 0 | 0 | 3 |
| 5 | 0 | 1 | 0 | 1 | 2 | 0 | 1 | 0 | 1 | 2 |
| 6 | 0 | 1 | 1 | 0 | 2 | × | × | × | × | 0 |
| 7 | 0 | 1 | 1 | 1 | 1 | × | × | × | × | 0 |

| distribution | two's complement | dual sign bit (M=1) |
|---|---|---|
| 0.00131 | 0.00392 | 0.00392 |
| 0.00261 | 0.00523 | 0.00523 |
| 0.00523 | 0.01045 | 0.00523 |
| 0.01045 | 0.01045 | 0.00000 |
| 0.02090 | 0.04181 | 0.04181 |
| 0.04181 | 0.04181 | 0.04181 |
| 0.08361 | 0.08361 | 0.25083 |
| 0.16722 | 0.00000 | 0.50167 |
| 0.33444 | 1.67222 | 1.33778 |
| 0.16722 | 0.50167 | 0.50167 |
| 0.08361 | 0.25083 | 0.16722 |
| 0.04181 | 0.08361 | 0.04181 |
| 0.02090 | 0.06271 | 0.06271 |
| 0.01045 | 0.02090 | 0.02090 |
| 0.00523 | 0.01045 | 0.00000 |
| 0.00261 | 0.00261 | 0.00000 |
| SUM | 2.80228 | 2.98275 |
| | Improve (%) | 1.06434 |

FIG. 3

$$\underbrace{-(2^N)(X_N) + \sum_{i=0}^{N-1}(2^i)(X_i)}_{\text{two's complement format}} = \underbrace{-(2^N)(X_N) + \sum_{i=M+1}^{N-1}(2^i)(X_i) \;-\; (2^M)(X_M)}_{\text{dual sign bit format}} + \underbrace{\sum_{i=0}^{M-1}(2^i)(X_i) + (2^{M+1})(X_M)}_{\text{conversion term}}$$

FIG. 4

SYSTEM, MEMORY DEVICE AND METHOD

CROSS REFERENCE

The present application claims priority to U.S. Provisional Application No. 63/563,810, filed on Mar. 11, 2024, which is herein incorporated by reference in its entirety.

BACKGROUND

A resistive random-access memory (ReRAM) cell is often used as the memory cell of a compute-in-memory device for a machine learning model. The ReRAM cell can be programed into a low-resistive state or a high-resistive state to store bits of the weights of the machine learning model. However, certain methodologies for the weights storage and access of a ReRAM face high power consumption imposed by a high occurrence of low-resistive state cell which consume large current to access.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3 is a table showing examples of the two's complement format and the dual sign bit format corresponding to FIGS. 2A-2B, in accordance with some embodiments of the present disclosure.

FIG. 4 is an equation showing the relation between the two's complement format and the dual sign bit format corresponding to FIGS. 2A and 2B, in accordance with some embodiments of the present disclosure.

DETAILED DESCRIPTION

Figure 1:
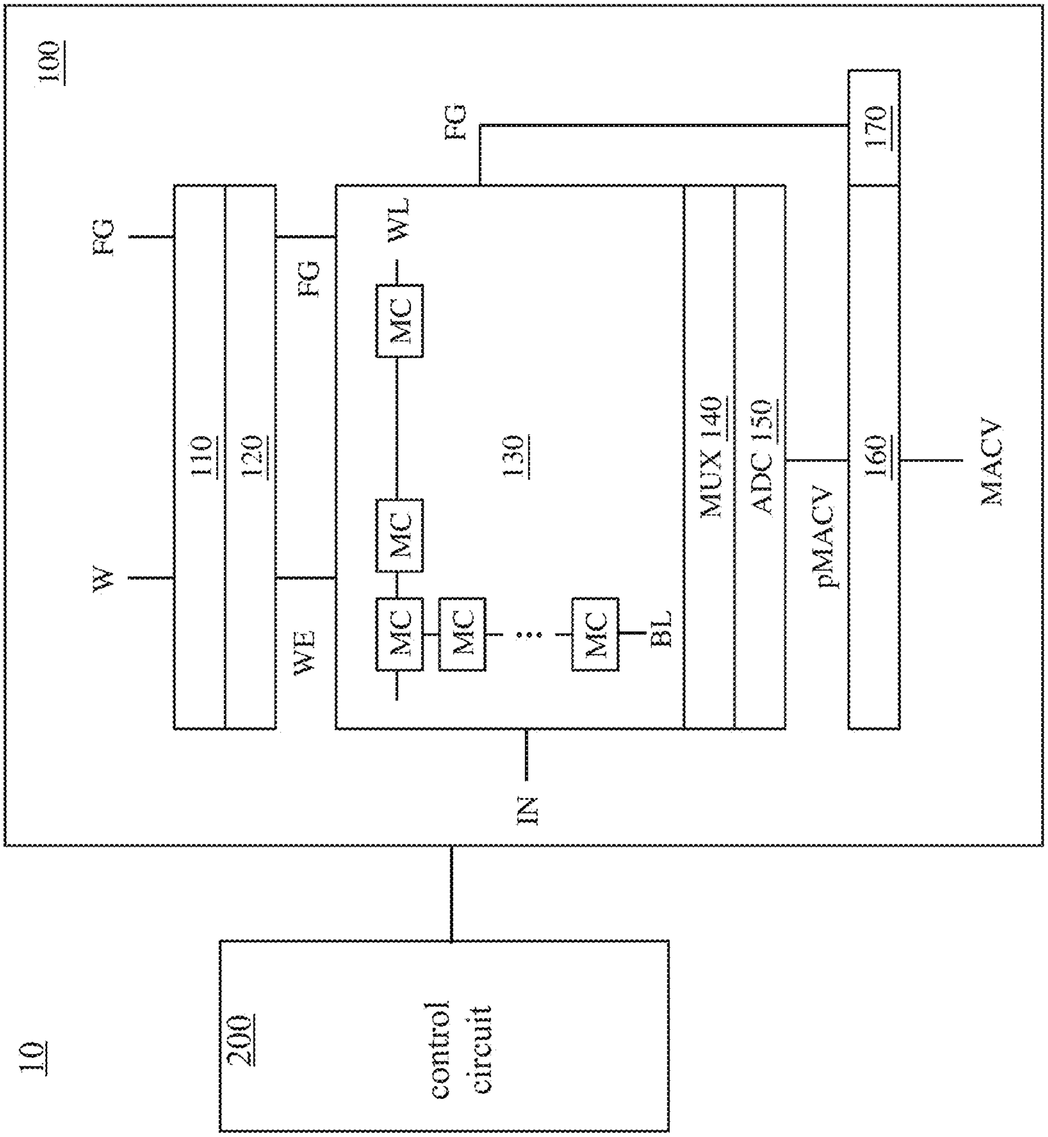
FIG. 1 is a schematic diagram of a system, in accordance with some embodiments of the present disclosure.

The following disclosure provides many different embodiments, or examples, for implementing different features of the provided subject matter. Specific examples of components, materials, values, steps, arrangements or the like are described below to simplify the present disclosure. These are, of course, merely examples and are not intended to be limiting. Other components, materials, values, steps, arrangements or the like are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. The term mask, photolithographic mask, photomask and reticle are used to refer to the same item.

The terms applied throughout the following descriptions and claims generally have their ordinary meanings clearly established in the art or in the specific context where each term is used. Those of ordinary skill in the art will appreciate that a component or process may be referred to by different names. Numerous different embodiments detailed in this specification are illustrative only, and in no way limits the scope and spirit of the disclosure or of any exemplified term.

It is worth noting that the terms such as "first" and "second" used herein to describe various elements or processes aim to distinguish one element or process from another. However, the elements, processes and the sequences thereof should not be limited by these terms. For example, a first element could be termed as a second element, and a second element could be similarly termed as a first element without departing from the scope of the present disclosure.

In the following discussion and in the claims, the terms "comprising," "including," "containing," "having," "involving," and the like are to be understood to be open-ended, that is, to be construed as including but not limited to. As used herein, instead of being mutually exclusive, the term "and/or" includes any of the associated listed items and all combinations of one or more of the associated listed items.

In the area of computing, signed number is often encoded in a two's complement format. However, for a machine learning application, the weights encoded in the two's complement format may include a large number of bit "1", which may increase the power consumption of a memory storing the weights. For example, the weights of a machine learning model often include a lot of negative numbers with small magnitude, in which the two's complement format of negative numbers with small magnitude include a large number of bit "1". In this case, memory like a resistive random-access memory will consume large power, since the current for accessing a bit "1" is larger than that for accessing a bit "0". An encoding format with lower occurrence of bits "1" helps reduce the power consumption of memory.

Reference is now made to FIG. 1. FIG. 1 is a schematic diagram of a system 10 in accordance with some embodiments of the present disclosure. As shown in FIG. 1, the system 10 includes a memory device 100 and a control circuit 200 coupled to the memory device 100. In some embodiments, the control circuit 200 is a processor, for example, a central processing unit (CPU) and/or a microcontroller unit (MCU). In some embodiments, the memory device 100 is configured as a compute-in-memory (CIM) device for multiply-and-accumulate (MAC) operations. For illustration, the memory device 100 includes an encoder 110, a memory writer 120, a memory array 130, a multiplexer (MUX) circuit 140, an analog-to-digital converter (ADC) circuit 150, an accumulator circuit 160 and a register circuit 170. In some embodiments, the encoder 110 encodes a weight W according to flag data FG indicating an encoding scheme to generate an encoded weight WE. The memory writer 120 writes the encoded weight WE and the flag data FG to the memory array 130. The memory array 130 performs a multiplication between the weight WE and an input IN and generates an output. The multiplexer circuit 140 transmits the output to the analog-to-digital converter circuit 150. The analog-to-digital converter circuit 150 converts the output into a digital signal as a partial MAC result pMACV. The register circuit 170 retrieves the flag data FG from the memory array 130. The accumulator circuit 160 decodes the partial MAC result pMACV according to the flag data FG in the register circuit 170 to generate a decoded partial MAC result pMACVD. In some embodiments, the accumulator circuit 160 accumulates multiple decoded partial MAC results pMACVD to generate a MAC result MACV. In some embodiments, the MAC result MACV corresponds to an output of a computational node of a machine learning model (e.g., a neural network).

For illustration, the encoder 110 is coupled to the memory writer 120. The memory writer 120 is further coupled to memory array 130. The memory array 130 is further coupled to the multiplexer circuit 140 and the register circuit 170. The multiplexer circuit 140 is further coupled to the analog-to-digital converter circuit 150. The analog-to-digital converter circuit 150 and the register circuit 170 are further coupled to the accumulator circuit 160.

The memory array 130 includes memory cells MC, word lines WL and bit lines BL. Each memory cell MC is at the intersection of a row with a column in the memory array 130. As illustratively shown in FIG. 1, the memory cells MC arranged in a same row are coupled to a same word line WL. The memory cells MC arranged in a same column are coupled to a same bit line BL.

In some embodiments, the memory array 130 can be non-volatile memory array. For example, the memory cells MC are operable so as to store a bit, i.e., "1" or "0", of data therein. In some embodiments, the memory cell MC is a resistive random-access memory (ReRAM) cell having a low-resistive state (LRS) or a high-resistive state (HRS). In some embodiments, the memory cell MC storing the bit "1" has the low-resistive state and the memory cell MC storing the bit "0" has the high-resistive state. In some embodiments, a memory cell MC having the low resistive state consumes more power than a memory cell MC having the high resistive state does.

In some embodiments, in order to reduce the power consumption, the encoder 110 encodes the weight W to decrease the memory cells MC having the low-resistive state. Specifically, the encoder 110 encodes the weight into the encoded weight WE, in which the occurrence of the bits "1" in the encoded weight WE is lower than that in the weight W. As a result, the number of memory cells MC having the low-resistive state in the memory cells MC storing the encoded weight WE is less than that in the memory cells MC storing the weight W. In other word, the power consumption of the memory cells MC storing the encoded weight WE is less than the power consumption of the memory cells MC storing the weight W. In some embodiments, the weight W is in a two's complement format. In some embodiments, the encoded weight WE is in a dual sign bit (DSB) format. In some embodiments, the encoder 110 does not encode the weight W when the flag data FG indicates the format of the weight W (i.e., the weight W and the encoded weight WE are in the same format.) For example, the encoder 110 directly output the weight W in the two's complement format as the encoded weight WE without encoding the weight W according to the flag data FG indicating the two's complement format.

Further details about the DSB format and the two's complement format for expressing the encoded weight WE are described in the following paragraphs with reference to FIGS. 2A-2B, 3-4 and 5A-5B.

Figure 2B:
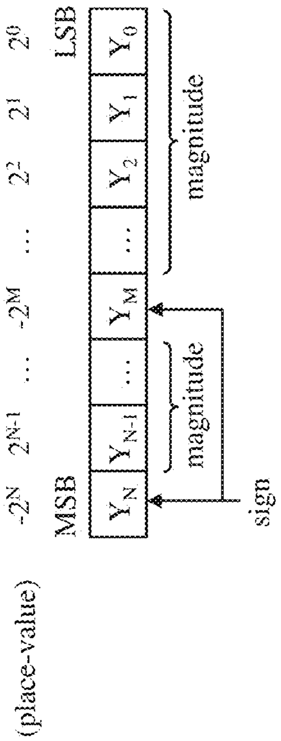
FIG. 2B is a schematic diagram of the dual sign bit format, in accordance with some embodiments of the present disclosure.
Figure 2A:
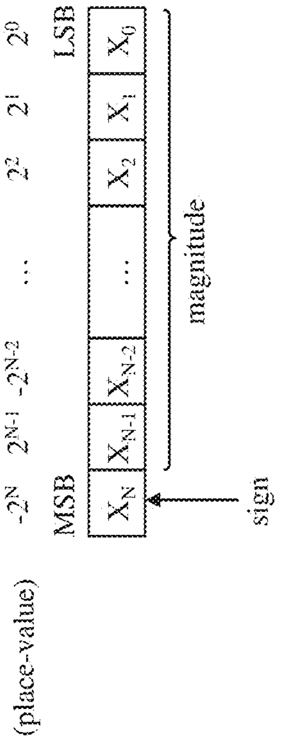
FIG. 2A is a schematic diagram of a two's complement format, in accordance with some embodiments of the present disclosure.

Reference is now made to FIGS. 2A and 2B. FIG. 2A is a schematic diagram of a two's complement format and FIG. 2B is a schematic diagram of the dual sign bit format, in accordance with some embodiments of the present disclosure.

The two's complement format utilizes binary digits to represent a signed number. In the two's complement format, the most significant bit (MSB) is a sign bit that corresponds to the sign to indicate whether the signed number is positive or negative. For example, when the most significant bit is 1, the signed number is signed as negative; and when the most significant bit is 0 the signed number is signed as positive.

In the two's complement format, the second most significant bit to the least significant bit (LSB) are magnitude bits representing the magnitude of the signed number. As shown in FIG. 2A, in a "N+1"-bit two's complement format ("N" being an integer), bits with place-values $2^{N-1}$ to $2^0$ are used to represent the magnitude of the signed number and the bit with a place-value $-2^N$ is used to represent the sign of the signed number. The decimal value DV of the signed number corresponding to FIG. 2A can be obtained by the following function, in which each of bits $X_0$ to $X_N$ are either "1" or "0".

$$DV = -(2^N)(X_N) + \sum_{i=0}^{N-1}(2^i)(X_i)$$

Similarly, the dual sign bit format in FIG. 2B utilizes binary digits to represent a signed number. The difference between the dual sign bit format and the two's complement format is that the dual sign bit format uses two bits to represent sign. Compared with the two's complement format, the dual sign bit format further uses a second sign bit different from the first sign bit (MSB) to represent sign. For example, as shown in FIG. 2B, in a "N+1"-bit dual sign bit format, the two bits with place-values $-2^N$ and $-2^M$ are used to represent sign, in which "M" is an integer smaller than "N". The decimal value DV of the signed number represented in the dual sign bit format in FIG. 2B can be obtained by the following function, in which each of bits $Y_0$ to $Y_N$ are either "1" or "0".

$$DV = -(2^N)(Y_N) + \sum_{i=M+1}^{N-1}(2^i)(Y_i) - (2^M)(Y_M) + \sum_{i=0}^{M-1}(2^i)(Y_i)$$

In some embodiments, the weight W includes numbers that are irrepresentable for the dual sign bit format. For example, values greater than or equal to "$2^N-2^M$" cannot be represented by the dual sign bit format. In some embodiments, weight including these irrepresentable values will not be encoded.

Reference is now made to FIG. 3. FIG. 3 is a table 300 showing examples of the two's complement format and the dual sign bit format corresponding to FIGS. 2A-2B, in accordance with some embodiments of the present disclosure.

For illustration, the table 300 shows multiple numerical value "−8 to 7" and their corresponding binary digits in 4-bit two's complement format and 4-bit dual sign bit format with "M" being one. The table 300 also shows occurrence of zero corresponding to each format, in which a greater occurrence of zero indicates better performance in power consumption reduction.

The columns of "# of zeros" shows the number of bit "0" corresponding to the binary digits of each numerical value in two's complement format or the dual sign bit format.

The symbol "x" indicates that the corresponding numerical value is irrepresentable for the dual sign bit format.

The column of "distribution" shows the distribution of the numerical values. According to some embodiments, the distribution of the numerical values corresponds to a computational node of a machine learning model.

The second rightmost column shows the multiplication between the distribution and the number of bit "0" corresponding to the two's complement format. The right most column shows the multiplication between the distribution and the number of bit "0" corresponding to the dual sign bit format. The row of "SUM" shows the sums of the values in these two columns. These sums indicate the occurrence of zeros corresponding to the two's complement format and the dual sign bit format.

The row of "Improve (%)" shows the improvement percentage of the occurrence of zeros of the dual sign bit format compared with that of the two's complement format. As shown in the table 300, the dual sign bit format is better than the two's complement format in the occurrence of zeros. In other words, the dual sign bit format consume less power than the two's complement format in the case of table 300.

Reference is now made to FIG. 4. FIG. 4 depicts an equation showing the relation between the two's complement format and the dual sign bit format corresponding to FIGS. 2A and 2B, in accordance with some embodiments of the present disclosure.

For illustration, the two's complement format of the signed number corresponding to FIG. 2A equals to a dual sign bit format plus a conversion term. According to some embodiments, the signed number in the two's complement format can be encoded into the dual sign bit format according to the conversion term.

A proof the equivalence shown in FIG. 4 is shown below.

$$
\begin{aligned}
&-(2^N)(X_N) + \sum_{i=0}^{N-1}(2^i)(X_i) \\
&= -(2^N)(X_N) + \sum_{i=M+1}^{N-1}(2^i)(X_i) + (2^M)(X_M) + \sum_{i=0}^{M-1}(2^i)(X_i) \\
&= -(2^N)(X_N) + \sum_{i=M+1}^{N-1}(2^i)(X_i) + (2^M)(X_M)(2-1) + \sum_{i=0}^{M-1}(2^i)(X_i) \\
&= -(2^N)(X_N) + \sum_{i=M+1}^{N-1}(2^i)(X_i) - (2^M)(X_M) + \sum_{i=0}^{M-1}(2^i)(X_i) + (2^{M+1})(X_M)
\end{aligned}
$$

As shown in the equations above, the two's complement format is proved equal to a dual sign bit format plus a conversion term. Details about encoding the signed number into the dual sign bit format according to the conversion term are discussed in the following paragraphs with reference to FIGS. 5A-5B.

Figure 5B:
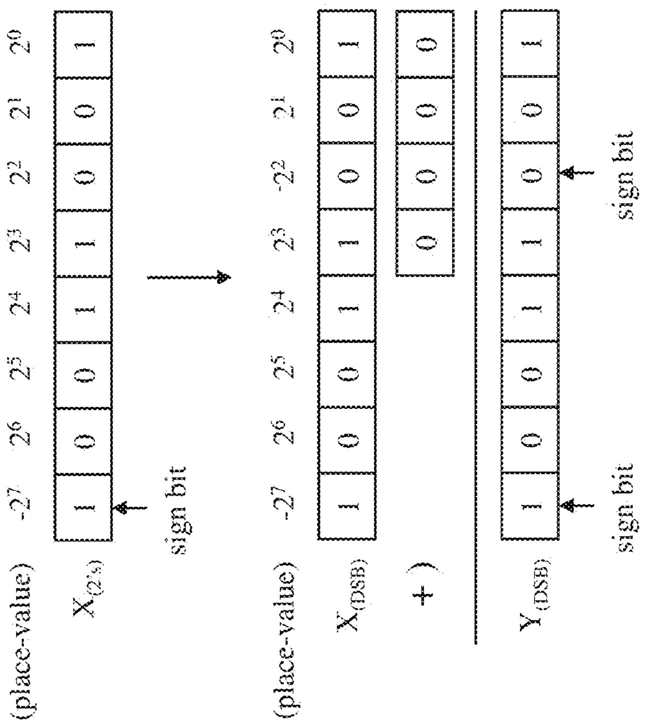
FIGS. 5A and 5B depict examples of encoding the signed number in the two's complement format into the dual sign bit format corresponding to FIGS. 2A-2B, in accordance with some embodiments of the present disclosure.
Figure 5A:
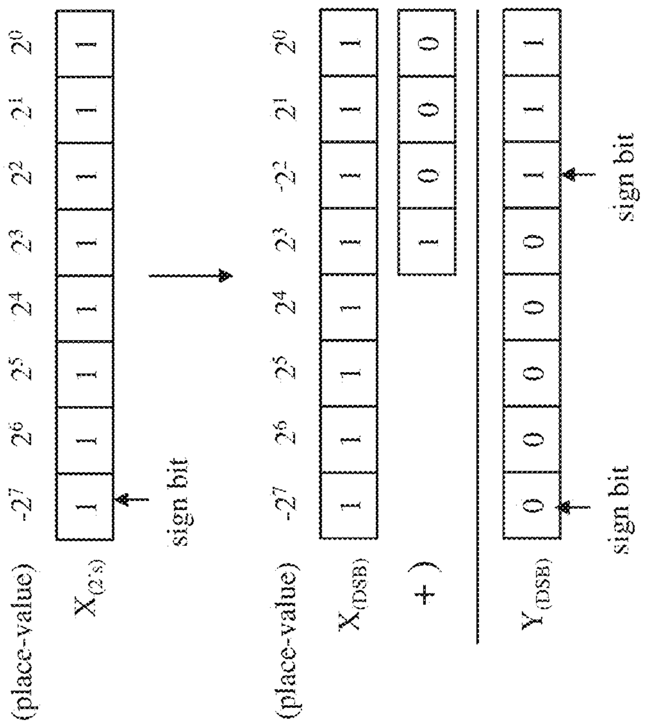

Reference is now made to FIGS. 5A and 5B. FIGS. 5A and 5B are schematic diagrams of examples of encoding the signed number in the two's complement format into the dual sign bit format corresponding to FIGS. 2A-2B, in accordance with some embodiments of the present disclosure.

To encode a signed number $X_{(2's)}$ in the two's complement format into the dual sign bit format with the "M−1"th bit from the LSB side as the sign bit, the place value $2^M$ of the signed number $X_{(2's)}$ is converted to −2M to generate a signed number $X_{(DSB)}$ in the dual sign bit format first. Then, the conversion term "$(2^{M+1})$ $(X_M)$" is added to the signed number $X_{(DSB)}$ to generate a signed number $Y_{(DSB)}$ in the dual sign bit format. The signed number $Y_{(DSB)}$ is the encoding result of the signed number $X_{(2's)}$ from the two's complement format to dual sign bit format. The signed number $X_{(2's)}$ and the signed number $Y_{(DSB)}$ correspond to the same numerical number.

In the example shown in FIG. 5A, the signed number $X_{(2's)}$ has eight bits "11111111" corresponding to a numerical number "−1". To generate the signed number $Y_{(DSB)}$ with the third bit from the LSB side as a sign bit (i.e., "M" is equal to four), the place value $2^2$ of the third bit is converted to $-2^2$ to generate the signed number $X_{(DSB)}$. Then, bits "1000" that correspond to the conversion term "$(2^{M+1})$ $(X_M)$" with "M" equal to four are added to the signed number $X_{(DSB)}$ to generate the signed number $Y_{(DSB)}$ having bits "00000111". According to the function corresponding to the dual sign bit format, the bits "00000111" correspond to the numerical number "$-2^2+2^1+2^0=-1$".

Similarly, In the example shown in FIG. 5B, the signed number $X_{(2's)}$ has eight bits "10011001" corresponding to a numerical number "−103". To generate the signed number $Y_{(DSB)}$ with the third bit from the LSB side as a sign bit (i.e., "M" is equal to four), the place value $2^2$ of the third bit is converted to $-2^2$ to generate the signed number $X_{(DSB)}$. Then, the conversion term with bits "0000" that correspond to the conversion term "$(2^{M+1})$ $(X_M)$" with "M" equal to four are added to the signed number $X_{(DSB)}$ to generate the signed number $Y_{(DSB)}$ having bits "10011001". According to the function corresponding to the dual sign bit format, the bits "10011001" correspond to the numerical number "$-2^7+2^4+2^3+2^0=-103$".

In some embodiments, after encoding the weight W into the encoded weight WE, the encoded weight WE is stored in the memory array 130 in FIG. 1 to generate bit line currents IBL.

Figure 6B:
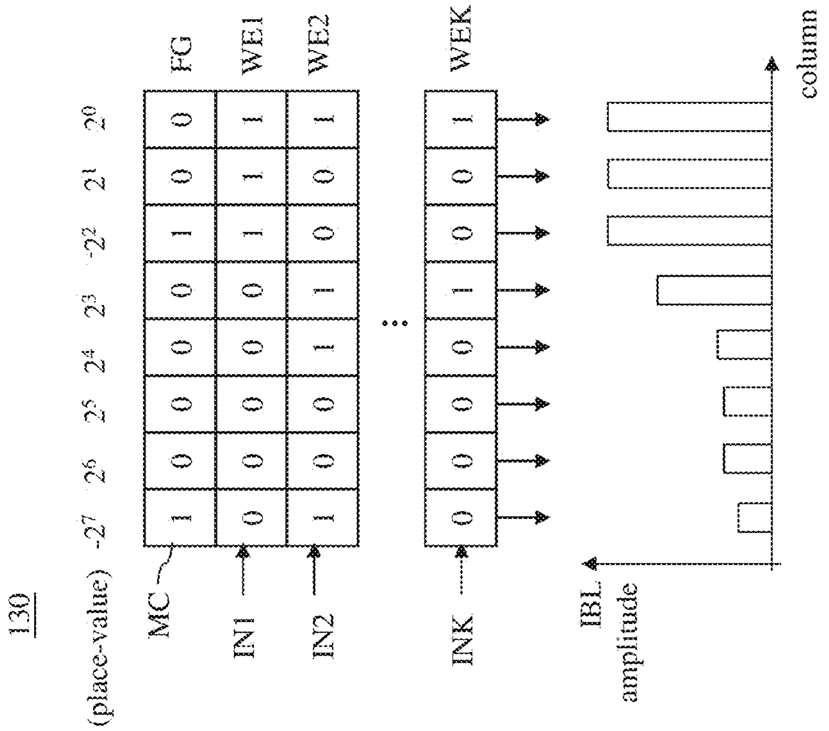
FIG. 6B depicts an example of generating bit line currents of the memory device in FIG. 1 with the dual sign bit format, in accordance with some embodiments of the present disclosure.
Figure 6A:
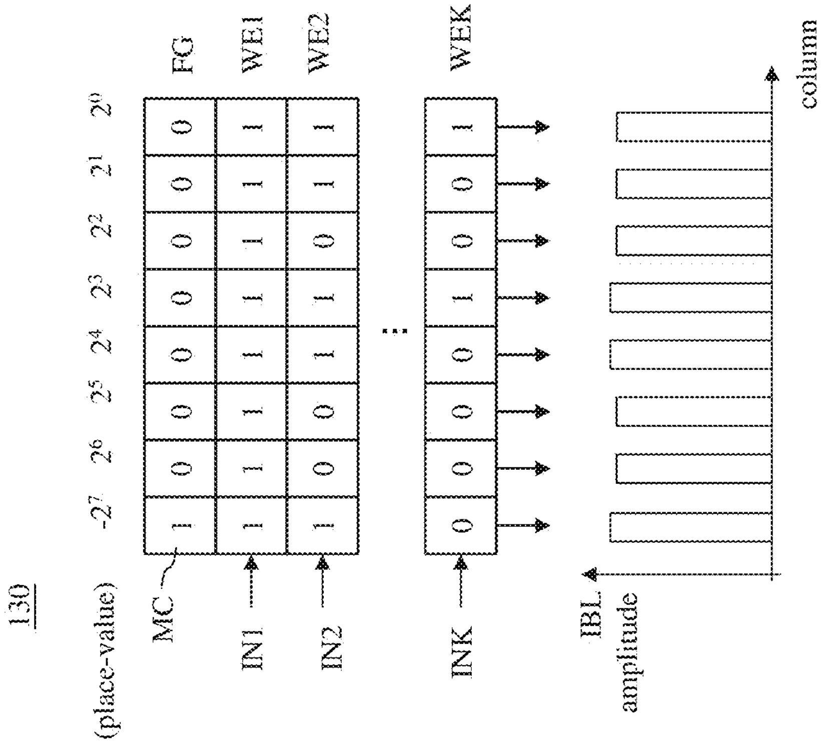
FIG. 6A depicts an example of generating bit line currents of a memory device in FIG. 1 with the two's complement format, in accordance with some embodiments of the present disclosure.

Reference is now made to FIG. 1, FIGS. 6A and 6B. FIG. 6A depicts an example of generating bit line currents IBL of the memory device 100 in FIG. 1 with the two's complement format, in accordance with some embodiments of the present disclosure. FIG. 6B depicts an example of generating bit line currents of the memory device 100 in FIG. 1 with the dual sign bit format, in accordance with some embodiments of the present disclosure.

With respect to the embodiments of FIGS. 1, 2A-2B, 3-4 and 5A-5B, like elements in FIGS. 5A-5B are designated with the same reference numbers for ease of understanding.

As shown in FIGS. 6A and 6B, the memory array 130 stores the flag data FG and multiple encoded weights WE (encoded weights WE1 to WEK). In some embodiments, the flag data FG is stored in the first row of memory cells MC. In some embodiments, the encoded weights WE1 to WEK are stored in the second to the "K"-th row of memory cells MC. In some embodiments, each bit of the flag data FG and the encoded weights WE1 to WEK are stored in a column of memory cells MC corresponding to the index number of the bit. For example, each of the flag data FG and the encoded weights WE1 to WEK has "N+1" bits. The bits from the LSB to the MSB have index number "0" to "N" respectively. The bits having index number "0" to "N" are stored in "N+1" columns from the right most column of the memory cells MC to the left most column of the memory cells MC respectively.

In some embodiments, in the flag data FG, a bit 1 indicates a sign bit. Specifically, the index of a bit 1 in the flag data FG indicates the index of a sign bit in the encoded weight WE. For example, in FIG. 6A, the bit 1, having an index number eight (i.e., the eighth bit from the LSB side), of the flag data FG indicates that corresponding bit, having the index number eight, of each encoded weight WE is sign bit.

In some embodiments, the flag data FG with the MSB being a bit 1 and other bits being bits 0 indicates that the encoded weights WE are in the two's complement format. In some embodiments, the flag data FG with the MSB and the "M"th bit from the LSB side being bits 1 and other bits being bits 0 indicates that the encoded weights WE are in the dual sign bit format with MSB being the first sign bit and the "M"th bit from the LSB side being the second sign bit.

For example, the flag data FG having bits "10000000" in FIG. 6A indicates the two's complement format. The flag data FG having bits "10000100" in FIG. 6B indicates the dual sign bit format with the third bit from the LSB side being the second sign bit.

In some embodiments, multiple inputs IN (inputs IN1 to INK) are input to the rows of the memory cells MC storing the encoded weights WE1 to WEK separately through word lines WL coupled to the rows. The memory array 130 performs a CIM operation (e.g., MAC operation) to the inputs IN and the encoded weights WE1 to WEK. In some embodiments, the memory array 130 multiplies the inputs IN1 to INK and the encoded weights WE1 to WEK respectively.

In some embodiments, the results, corresponding to the same place-value, of the multiplication of the IN1 to INK and the encoded weights WE1 to WEK are accumulated and output through a corresponding bit line BL.

According various embodiments, the occurrence of zero of the dual sign bit format may be greater than that of the two's complement format. Therefore, the amplitude of the current IBL corresponding to the accumulated result on the bit line BL of the dual sign bit format may be smaller than that of the two's complement format. For example, while the numerical numbers of the encoded weights WE1 to WEK stored in the memory array 130 in FIG. 6A are equal to the numerical numbers of the encoded weights WE1 to WEK stored in the memory array 130 in FIG. 6B, the current IBL of the memory array 130 corresponding to the two's complement format in FIG. 6A may be greater than the current IBL of the memory array 130 corresponding to the dual sign bit format in FIG. 6B.

After the current IBL generated, the multiplexer circuit 140 of FIG. 1 transmits the current IBL to the analog-to-digital converter circuit 150. The analog-to-digital converter circuit 150 performs an analog-to-digital conversion to the current IBL to generate the partial MAC result pMACV.

The partial MAC result pMACV is generated according to the current IBL. As a result, while the numerical numbers of the encoded weights WE1 to WEK stored in the memory array 130 corresponding to the two's complement format are equal to the numerical numbers of the encoded weights WE1 to WEK stored in the memory array 130 corresponding to the dual sign bit format, the partial MAC result pMACV of the memory array 130 corresponding to the two's complement format may be greater than the partial MAC result pMACV of the memory array 130 corresponding to the dual sign bit format.

In some embodiments, the accumulator circuit 160 decodes the partial MAC result pMACV of the dual sign bit format into the decoded partial MAC result $pMACV_D$. The decoded partial MAC result $pMACV_D$ corresponds to the partial MAC result pMACV multiplying the sign of the place-value corresponding the partial MAC result pMACV.

In some embodiments, the register circuit 170 includes multiple flip-flops. In some embodiments, the flip-flops are D-type flip flops. In some embodiment, the bits of the flag data FG are stored in the flip-flops separately.

Figure 7:
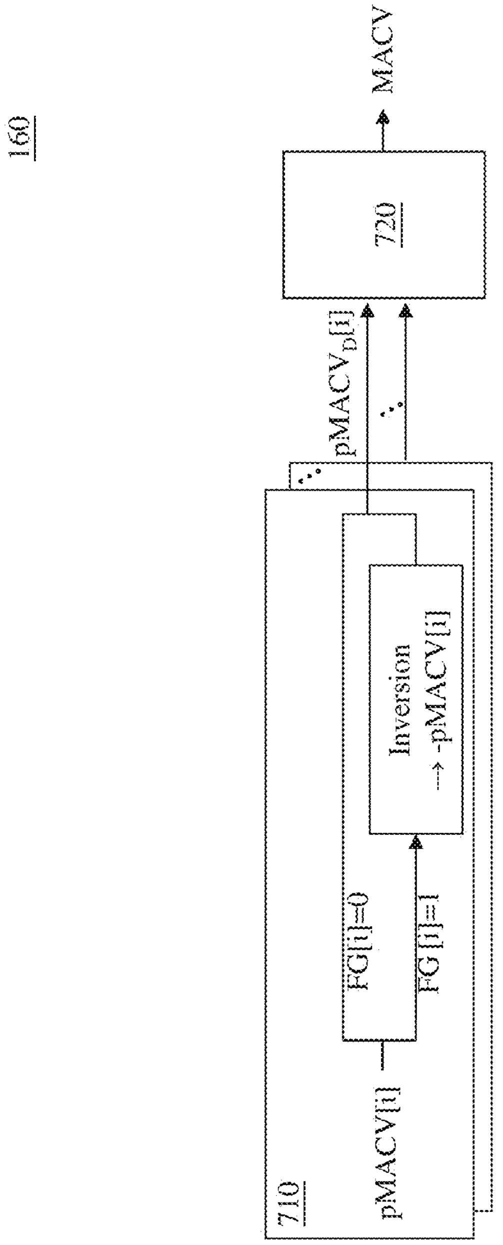
FIG. 7 is a schematic diagram of the accumulator circuit of the memory device corresponding to FIGS. 1, 6A and 6B, in accordance with some embodiments of the present disclosure.

Reference is now made to FIGS. 1, 6A, 6B and 7. FIG. 7 is a schematic diagram of the accumulator circuit 160 of the memory device 100 corresponding to FIGS. 1, 6A and 6B, in accordance with some embodiments of the present disclosure. With respect to the embodiments of FIGS. 1, 2A-2B, 3-4, 5A-5B and 6A-6B like elements in FIG. 7 are designated with the same reference numbers for ease of understanding.

In some embodiments, the accumulator circuit 160 includes one or more recovery circuit 710 and a shifter-and-adder circuit 720. The recovery circuit 710 receives a partial MAC result pMACV corresponding to a column of memory cells MC. For example, the analog-to-digital converter circuit 150 outputs multiple partial MAC results pMACV including partial MAC results pMACV[0] to pMACV[N]. The partial MAC results pMACV[0] to pMACV[N] corresponds to "N" bits, from the LSB to the MSB, of the flag data FG and the encoded weights WE. For example, a partial MAC result pMACV[i] corresponds to the "i"th bit of the flag data FG and the encoded weights WE, in which "i" is one of the integers from "1" to "N". The partial MAC result pMACV[i] is transmitted through the bit line BL of the column of the memory cells MC corresponding to the "i"th bit (e.g., the "i"th column from the right).

In some embodiments, the recovery circuit 710 decodes the partial MAC result pMACV according to the flag data FG in the register circuit 170. For example, to decode the partial MAC result pMACV[i], the recovery circuit 710 directly outputs the partial MAC result pMACV[i] as a decoded partial MAC result $pMACV_D[i]$ when the "i"th bit FG[i] of the flag data FG in the register circuit 170 is a bit 0. The recovery circuit 710 inverts the partial MAC result pMACV[i] and output the inversion of the partial MAC result pMACV[i] as the decoded partial MAC result $pMACV_D[i]$ when the "i"th bit FG[i] of the flag data FG in the register circuit 170 is a bit 1.

In some embodiments, the shifter-and-adder circuit 720 shifts and combines multiple decoded partial MAC results $pMACV_D$ (e.g., the decoded partial MAC results $pMACV_D$ [0] to $pMACV_D[N]$) according a corresponding place-value of the two's complement format to generate the MAC result MACV. For example, the shifter-and-adder circuit 720 shift each decoded partial MAC result $pMACV_D[i]$ by "i" bits and combines all the shifted decoded partial MAC result $pMACV_D[i]$ to generate the MAC result MACV.

Figure 8:
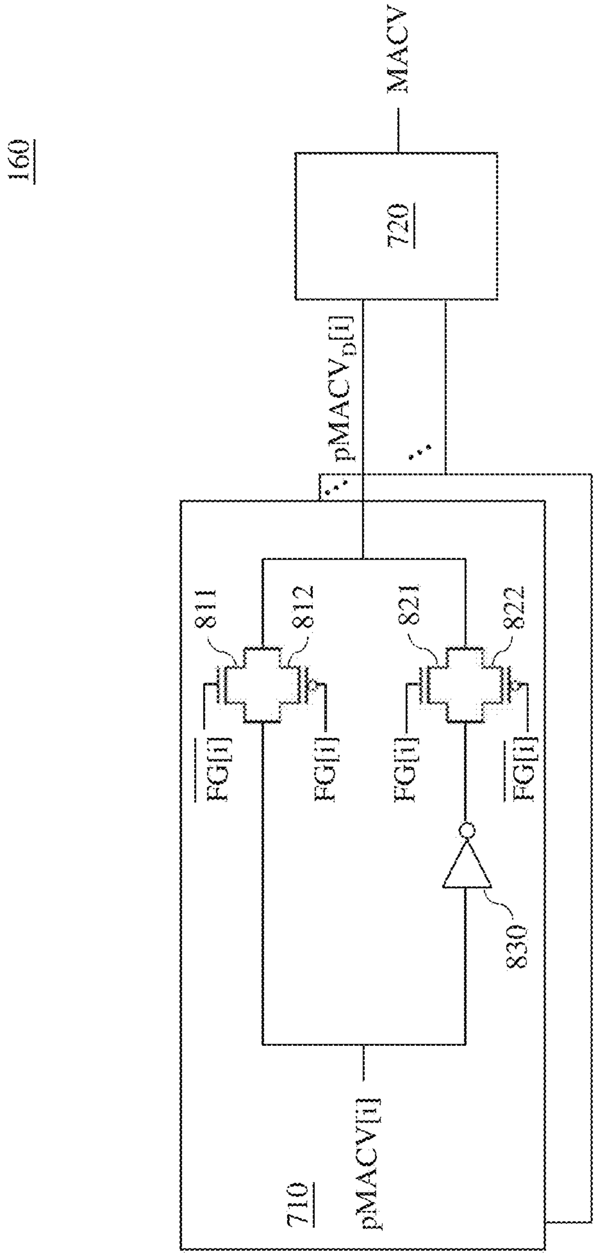
FIG. 8 is a schematic diagram of the accumulator circuit of the memory device corresponding to FIGS. 1, 6A-6B and 7 in accordance with some embodiments of the present disclosure.

Reference is now made to FIGS. 1, 6A, 6B, 7 and 8. FIG. 8 is a schematic diagram of the accumulator circuit 160 of the memory device 100 corresponding to FIGS. 1, 6A-6B and 7 in accordance with some embodiments of the present disclosure. With respect to the embodiments of FIGS. 1, 2A-2B, 3-4, 5A-5B, 6A-6B and 7, like elements in FIG. 8 are designated with the same reference numbers for ease of understanding.

As shown in FIG. 8, in some embodiments, the accumulator circuit 160 includes switches 811, 812, 821 and 822, and an inverter 830. In some embodiments, the switches 811 and 821 are n-type transistors. The switches 812 and 822 are p-type transistors. In some embodiments, the switches 811 and 812 are operated as a transmission gate. The switches 821 and 822 are operated as a transmission gate.

For illustration, the source terminals of the switches 811 and 812, and the input terminal of the inverter 830 are coupled together to the analog-to-digital converter circuit 150 to receive the partial MAC result pMACV[i]. The control terminals of the switches 812 and 821 are coupled to the register circuit 170 to receive the bit FG[i]. The control terminals of the switches 811 and 822 are coupled to the register circuit 170 to receive an inversion $\overline{FG[i]}$ of the bit FG[i]. The drain terminals of the switches 811, 812, 821 and 822 are coupled together to output the decoded partial MAC result $pMACV_D[i]$ to the shifter-and-adder circuit 720.

The inverter 830 inverts the partial MAC result pMACV [i]. The switches 811 and 812 are turned on in response to the bit FG[i] being a bit 0. The switches 811 and 812 are turned off in response to the bit FG[i] being a bit 1. On the contrary, the switches 821 and 822 are turned on in response to the bit FG[i] being a bit 1. The switches 821 and 822 are turned off in response to the bit FG[i] being a bit 0. As a result, the recovery circuit 710 directly output the partial MAC result pMACV[i] as a decoded partial MAC result $pMACV_D[i]$ when the bit FG[i] is a bit 0. The recovery circuit 710 outputs the inversion of the partial MAC result pMACV[i] as the decoded partial MAC result $pMACV_D[i]$ when the bit FG[i] is a bit 1.

The configurations of FIGS. 1, 2A-2B, 3-4, 5A-5B, 6A-6B and 7-8 are given for illustrative purposes. Various implements are within the contemplated scope of the present disclosure. For example, in some embodiments, the register circuit 170 further includes an inverter for generating the inversion $\overline{FG[i]}$.

Figure 9:
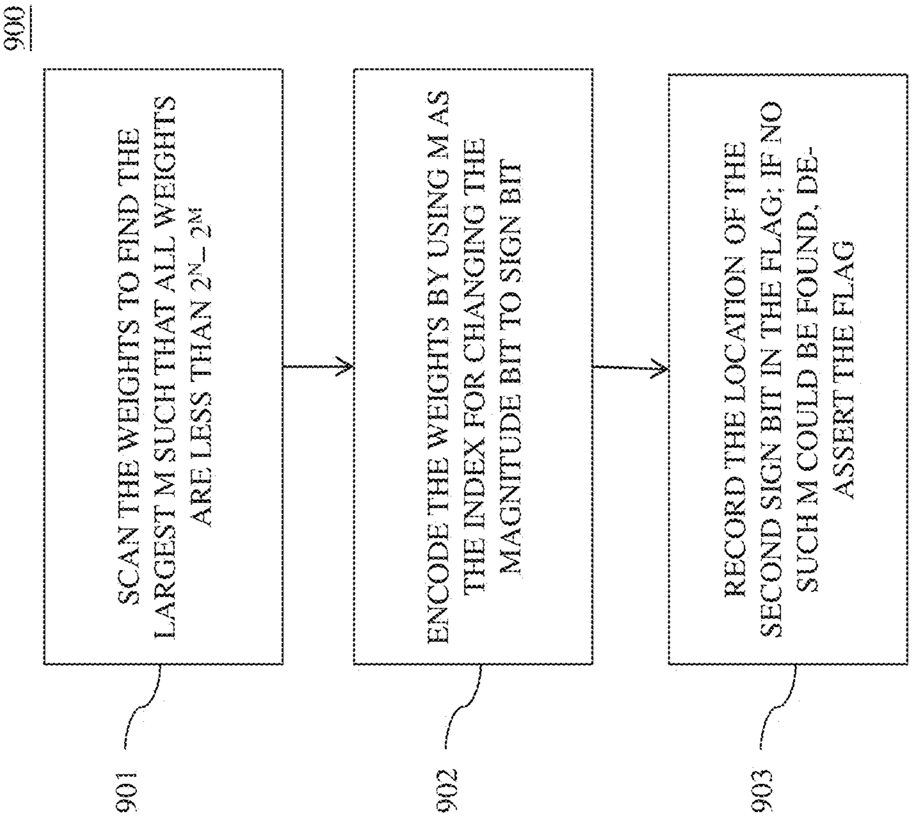
FIG. 9 is a flowchart diagram of a method for operating a memory device, in accordance with some embodiments of the present disclosure.

Reference is now made to FIG. 9. FIG. 9 is a flowchart diagram of a method 900 for operating a memory device corresponding to, for example, the memory device 100 corresponding to FIGS. 1, 2A-2B, 3-4, 5A-5B, 6A-6B and 7-8, in accordance with some embodiments of the present disclosure. It is understood that additional operations can be provided before, during, and after the processes shown by FIG. 9, and some of the operations described below can be replaced or eliminated, for additional embodiments of the method 900. The order of the operations/processes may be interchangeable. Throughout the various views and illustrative embodiments, like reference numbers are used to designate like elements. The method 900 includes operations 901 to 903 that are described below with reference to the memory device 100 corresponding to FIGS. 1, 2A-2B, 3-4, 5A-5B, 6A-6B and 7-8.

In some embodiments, the encoder 110 performs the encode operation according to the method 900.

In operation 901, the control circuit 200 determines the value of "M" (the index number of the second sign bit) for the dual sign bit format to avoid the weight W being irrepresentable. Specifically, the control circuit 200 scans all weights W (e.g., weights of a kernel of a convolution neural network) for computing the MAC result MACV to find the largest value of "M" that satisfies the limitation of the numerical value of each weight W being less than "$2^N-2^M$".

In operation 902, the encoder 110 encodes the weights W into the dual sign bit format by change the bit with the index number "M" from a magnitude bit to a sign bit.

In operation 903, the encoder 110 marks the weights W as encoded weights and records the index number of the second sign bit in the flag data FG. In some embodiments, when there is no "M" satisfying the limitation of the numerical value of each weight W being less than "$2^N-2^M$", the encoder 110 does no encoding and de-asserts the flag data FG.

Figure 10:
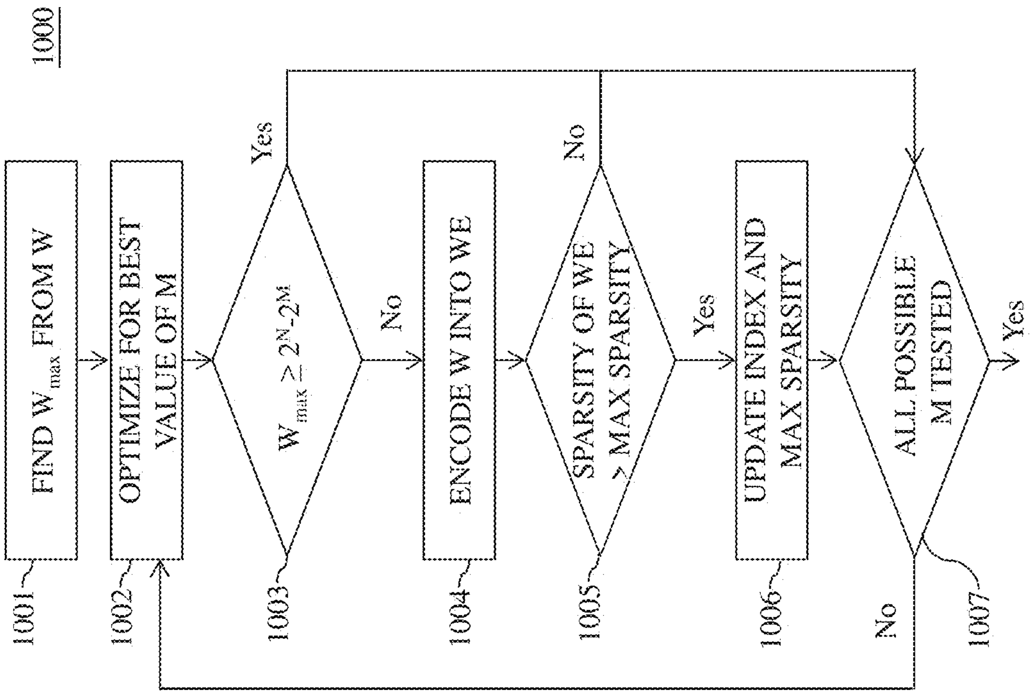
FIG. 10 is a flowchart diagram of a method for operating a memory device, in accordance with some embodiments of the present disclosure.

Reference is now made to FIG. 10. FIG. 10 is a flowchart diagram of a method 1000 for operating a memory device corresponding to, for example, the memory device 100 corresponding to FIGS. 1, 2A-2B, 3-4, 5A-5B, 6A-6B and 7-9, in accordance with some embodiments of the present disclosure. It is understood that additional operations can be provided before, during, and after the processes shown by FIG. 10, and some of the operations described below can be replaced or eliminated, for additional embodiments of the method 1000. The order of the operations/processes may be interchangeable. Throughout the various views and illustrative embodiments, like reference numbers are used to designate like elements. The method 1000 includes operations 1001 to 1007 that are described below with reference to the memory device 100 corresponding to FIGS. 1, 2A-2B, 3-4, 5A-5B, 6A-6B and 7-9.

In some embodiments, the encoder 110 performs the encode operation according to the method 1000. In some embodiments, the operations 1001-1007 are performed by the control circuit 200 to determine a best index number of the second sign bit for the encoder 110. In some embodiments, the control circuit 200 performs the operations 1001 to 1007 and provides the inputs IN, the weights W and the flag data FG to the memory device 100 to perform the MAC operation.

In operation 1001, a maximum $W_{max}$ among the numerical values of all weights W for computing the MAC result MACV is determined.

In operation 1002, the value of "M" (the index number of the second sign bit) for test is optimized for the dual sign bit format. In some embodiments, the value of "M" for test is set as the greatest one of all possible values. In some embodiments, the value of "M" for test is initially set as the MSB's index number minus two. After the operation 1002, a test is performed with the operations 1003 to 1007 to determine whether the tested value of "M" is a best value for the index number of the second sign bit.

In operation 1003, whether the maximum $W_{max}$ is greater than or equal to "$2^N-2^M$" is determined to avoid overflow. In other words, whether the maximum $W_{max}$ is greater than or equal to "$2^N-2^M$" is determined to ensure that the maximum $W_{max}$ is representable by the dual sign bit format. In some embodiments, a comparison between the maximum $W_{max}$ and "$2^N-2^M-1$" is performed to determine whether the maximum $W_{max}$ is greater than "$2^N-2^M-1$" to avoid overflow.

In some embodiments, operation 1004 is performed after the maximum $W_{max}$ is determined not greater than or equal to "$2^N-2^M$" (or not greater than "$2^N-2^M-1$"). In operation 1004, the weights W to the encoded weights WE in the dual sign bit format with the second sign bit index number as "M".

In operation 1005, the sparsity of the encoded weights WE is determined and a comparison between the sparsity and a max sparsity is performed. In some embodiments, the sparsity of the encoded weights WE is a number proportional to the occurrence of zeros as described above with reference to FIG. 3. In some embodiments, the first determined sparsity of the encoded weights WE corresponding to the first tested value of "M" is determined as the max sparsity in the first iteration of the test. In some embodiments, whether the sparsity of the encoded weights WE is greater than the max sparsity is determined to ensure that the occurrence of zeros increases.

In some embodiments, operation 1006 is performed after the sparsity of the encoded weights WE is determined greater than the max sparsity in operation 1005. In operation 1006, the max sparsity is updated with the sparsity of the encoded weights WE. A temporary best index number of the second sign bit is updated with the tested value of "M".

In operation 1007, a determination of whether all possible values of "M" are tested is performed. In some embodiments, operation 1007 is performed after the maximum $W_{max}$ is determined greater than or equal to "$2^N-2^M$" (or greater than "$2^N-2^M-1$") in operation 1003. In some embodiments, operation 1007 is performed after the sparsity of the encoded weights WE is determined not greater than the max sparsity in operation 1005.

When the determination in operation 1007 indicates that all possible values of "M" are tested, the temporary best index number of the second sign bit is determined as the best index number of the second sign bit.

When the determination in operation 1007 indicates that not all possible values of "M" are tested, the operation 1002 is repeated. In the repeated operation 1002, a new value of "M" for test is determined among all possible values of "M" that are not tested yet. In some embodiments, the value of "M" for test is set as the previously tested value of "M" minus one.

Figure 11:
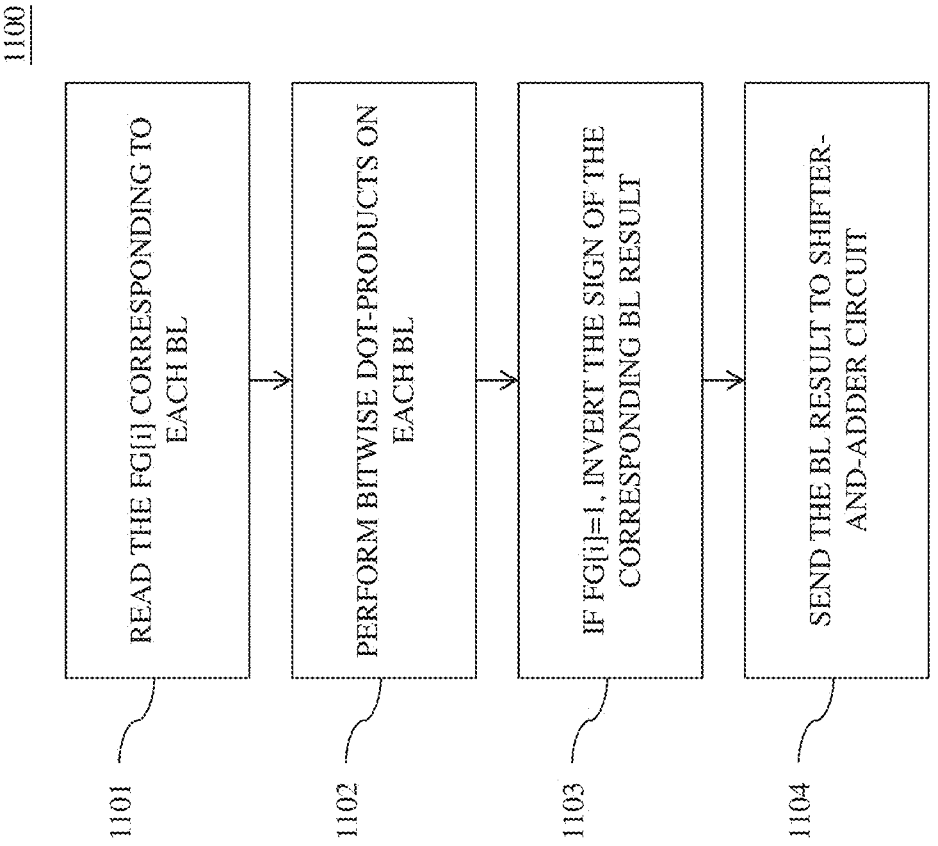
FIG. 11 is a flowchart diagram of a method for operating a memory device, in accordance with some embodiments of the present disclosure.

Reference is now made to FIG. 11. FIG. 11 is a flowchart diagram of a method 1100 for operating a memory device corresponding to, for example, the memory device 100 corresponding to FIGS. 1, 2A-2B, 3-4, 5A-5B, 6A-6B and 7-10, in accordance with some embodiments of the present disclosure. It is understood that additional operations can be provided before, during, and after the processes shown by FIG. 11, and some of the operations described below can be replaced or eliminated, for additional embodiments of the method 1100. The order of the operations/processes may be interchangeable. Throughout the various views and illustrative embodiments, like reference numbers are used to designate like elements. The method 1100 includes operations 1101 to 1107 that are described below with reference to the memory device 100 corresponding to FIGS. 1, 2A-2B, 3-4, 5A-5B, 6A-6B and 7-10.

In some embodiments, the memory device 100 performs a MAC operation between the encoded weights WE and the inputs IN and generates a MAC result according to the method 1100.

In operation 1101, the encoder 110 receives the flag data FG. In some embodiments, the flag data FG includes bits FG[0] to FG[N], in which the bits corresponding to sign bits have values "1" and the bits corresponding to magnitude bits have values "0". The memory writer 120 writes the bit FG[i] of flag data FG to a corresponding column of a corresponding bit line BL as shown in FIGS. 6A and 6B. The register circuit 170 reads the bit FG[i] corresponding to each bit line BL and stores the bit FG[i].

In operation 1102, the memory array 130 performs bitwise dot-products of inputs IN and bits of the encoded weights W. The memory array 130 performs a dot-product to the inputs IN and the bits, stored in the same column, of the encoded weights W and generates the current IBL on the bit line BL corresponding to the column as a dot-product result.

The multiplexer circuit 140 and the analog-to-digital converter circuit 150 generate the partial MAC result pMACV[i] of each bit lines BL. Each partial MAC result pMACV[i] is generated according to the current IBL on the corresponding bit line BL.

In operation 1103, the recovery circuit 710 inverts the sign of the partial MAC result pMACV[i] of a bit line BL when the bit FG[i] corresponding to the bit line BL is a bit 1. On the contrary, the recovery circuit 710 does no inversion to the sign of the partial MAC result pMACV[i] of a bit line BL when the bit FG[i] corresponding to the bit line BL is a bit 0.

In operation 1104, the recovery circuit 710 sends the partial MAC result pMACV[i] to the shifter-and-adder circuit 720. The shifter-and-adder circuit 720 accumulates multiple partial MAC results pMACV[i] to generate the MAC result MACV.

Figure 12:
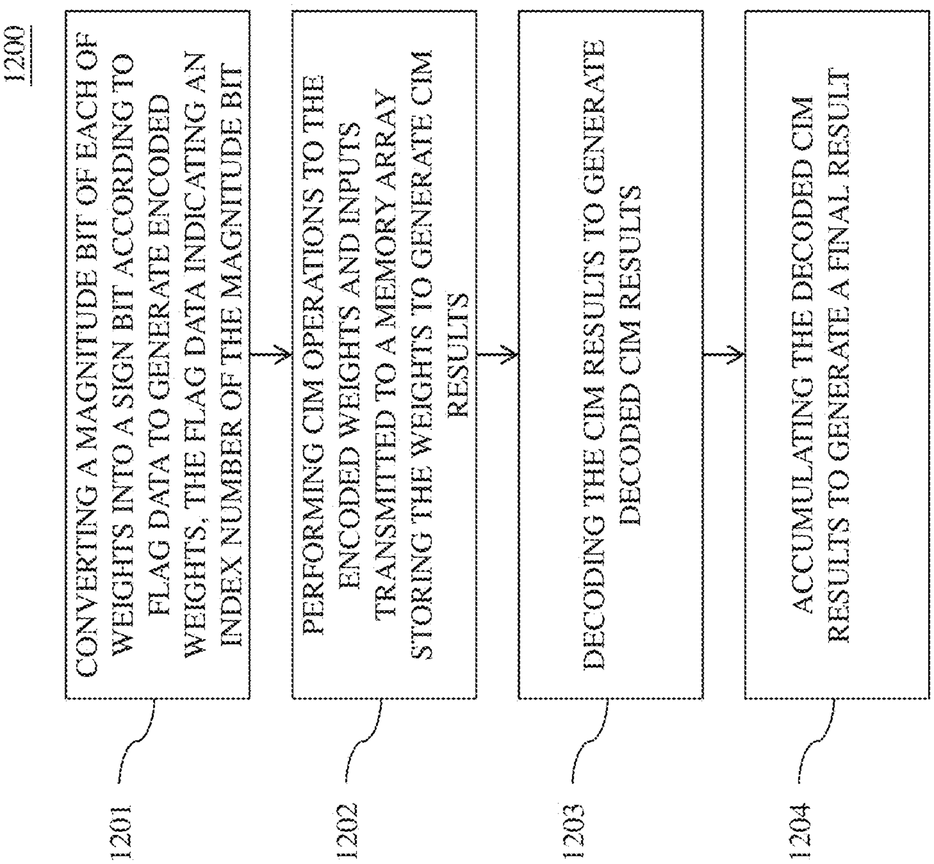
FIG. 12 is a flowchart diagram of a method for operating a memory device, in accordance with some embodiments of the present disclosure.

Reference is now made to FIG. 12. FIG. 12 is a flowchart diagram of a method 1200 for operating a memory device corresponding to, for example, the memory device 100 corresponding to FIGS. 1, 2A-2B, 3-4, 5A-5B, 6A-6B and 7-11, in accordance with some embodiments of the present disclosure. It is understood that additional operations can be provided before, during, and after the processes shown by FIG. 12, and some of the operations described below can be replaced or eliminated, for additional embodiments of the method 1200. The order of the operations/processes may be interchangeable. Throughout the various views and illustrative embodiments, like reference numbers are used to designate like elements. The method 1200 includes operations 1201 to 1204 that are described below with reference to the memory device 100 corresponding to FIGS. 1, 2A-2B, 3-4, 5A-5B, 6A-6B and 7-11.

In operation 1201, the encoder 110 encodes the weights W into the form of dual sign bit. The encoder 110 converts a magnitude bit of each of the weights W into a sign bit according to the flag data FG to generate the encoded weights WE. The flag data indicates an index number of the magnitude bit to be converted.

In operation 1202, the memory array 130, the multiplexer circuit 140 and the analog-to-digital circuit perform CIM operations to the encoded weights WE and inputs IN transmitted to the memory array 130 to generate CIM results (e.g., the partial MAC results pMACV).

In operation 1203, the accumulator circuit 160 decodes the CIM results to generate decoded results (e.g., the decoded partial MAC results $pMACV_D[\mathbf{0}]$ to $pMACV_D[N]$) according to the flag data FG.

In some embodiments, the accumulator circuit 160 inverts a CIM result (e.g., the partial MAC results pMACV[i]) of the CIM results according to a corresponding bit (e.g., the bit FG[i]) of the flag data FG being a bit one to generate one of the decoded CIM results (e.g., the decoded partial MAC result $pMACV_D[i]$).

In operation 1204, the accumulator circuit 160 accumulates the decoded results to generate a final result (e.g., the MAC result MACV).

In some embodiments, the shifter-and-adder circuit 720 performs a shift-and-add operation to each of the decoded CIM results according to a place of the column to generate the final result. For example, in the shift-and-add operation, the shifter-and-adder circuit 720 shifts the decoded partial MAC result $pMACV_D[i]$ according the place of the column (e.g., being the "i+1"th column from the right) corresponding to the decoded partial MAC result $pMACV_D[i]$ to generate a shifted decoded partial MAC result $pMACV_D[i]$. Then the shifter-and-adder circuit 720 adds the shifted decoded partial MAC result $pMACV_D[i]$ to a temporary result. The temporary result is a result of addition of shifted decoded partial MAC results. After the shift-and-add operations to all decoded partial MAC results are performed, the temporary result is determined as the MAC result MACV.

In some embodiments, the encoder 110 converts a magnitude bit, having a test index number, of each of the weights W into the sign bit to generate test encoded weights. The test index number is determined as the index number of the bit to be converted into the sign bit in the dual sign bit format according to sparsity of the test encoded weights.

In some embodiments, the control circuit 200 determines the index number of the bit to be converted into the sign bit according to a maximum value of the weights W. For example, the index number is configured to satisfy the limitation of the value "$2^N-2^M$" being less than maximum value of the weights W. "M" is the index number of the bit to be converted into the sign bit and "N" is the index number of the MSB of the weight W.

In some embodiments, the control circuit 200 generates the flag data FG with bits with values "1" indicating the indexes of the sign bits and bits with values "0" indicating the indexes of magnitude bits.

In summary, the memory device and the method for operating the memory device help reduce power consumption in memory access. The weights encoded in the dual sign bit format has higher occurrence of zeros. As a result, the memory array will have more cells with high resistive state which consume less current to access. Compared to some approaches, the average energy consumption for weights of integer-8 bit and binary floating point-8 bit is improved by about 1.33 times and 1.29 times respectively. The peak energy consumption for weights of integer-8 bit and binary floating point-8 bit is improved by about 1.55 times and 1.39 times respectively.

Also disclosed is a memory device. The memory device comprises: an encoder circuit configured to convert a first bit of each of weights into a sign bit to generate encoded weights according to flag data; a memory array comprising memory cells, in which the memory cells arranged in a same column are configured to store bits, of the encoded weights and the flag data, having the same index number, in which the memory array is configured to perform a compute-in-memory (CIM) operation to the encoded weights and inputs to generate CIM results, in which each of the CIM results corresponds to a column of the memory array; and an accumulator circuit configured to decode the CIM results according to the flag data to generate decoded CIM results.

In some embodiments, the flag data indicates a first index number. The encoder circuit converts the first bit having the first index number into the sign bit and add a value of the first bit to a second bit of each of weights. The second bit has a second index number that is greater than the first index number by one.

In some embodiments, the weights are in a two's complement format and the encoded weights are in a dual sign bit format that has two sign bits.

In some embodiments, index numbers of bits having values of one in the flag data correspond to index numbers of sign bits of the encoded weights.

In some embodiments, the memory array is further configured to generate currents corresponding to the columns of the memory array according to the CIM operation, in which the memory device further comprises: an analog-to-digital converter configured to perform an analog-to-digital conversion to the currents to generate the CIM results.

In some embodiments, the memory device further comprises a register circuit configured to retrieve the flag data from the memory array, in which the accumulator circuit comprises: recovery circuits configured to decode the CIM results according to the flag data from the register circuit to generate the decoded CIM results; and a shifter-and-adder circuit configured to accumulate the decoded CIM results to generate a final result.

In some embodiments, each of the recovery circuits is configured to decode a corresponding CIM result of the CIM results according to a corresponding flag bit of the flag data, in which the each of the recovery circuits comprises: a first transmission gate configured to turn on, in response to the corresponding flag bit having a value of zero, to output the corresponding CIM result as a corresponding one of the decoded CIM results; an inverter configured to invert the corresponding CIM result to generate an inversion; and a second transmission gate configured to turn on, in response to the corresponding flag bit having a value of one, to output the inversion as the corresponding one of the decoded CIM results.

In some embodiments, an index number of the sign bit is set equal to a number "N", in which a value of "$2^M-2^N$" is less than a maximum value of the weights, in which the number "M" corresponds to the largest index number of the bits of the weights.

Also disclosed is a memory device. The memory device comprises: an encoder circuit configured to convert weights in form of two's complement into encoded weights in form of dual sign bit according to flag data, in which each of the encoded weights has two sign bits; a memory array comprising memory cells, in which a first row of the memory cells is configured to store the flag data and second rows of the memory cells are configured to store the encoded weights, in which the memory array is configured to perform dot-product operations to the encoded weights and inputs on word lines of the memory array to generate dot-product results on bit lines of the memory array; an analog-to-digital converter circuit configured to convert the dot-product results into digital dot-product results; and an accumulator circuit configured to decode the digital dot-product results according to the flag data to generate decoded dot-product results.

In some embodiments, the encoder circuit is further configured to convert a first bit of each of the weights into a sign bit and add the value of the first bit to a second bit of each of the weights, in which the index number of the second bit is greater than the index number of the first bit by one.

In some embodiments, a first sign bit of the two sign bits is a most significant bit of each of the encoded weights, in which the memory device further comprises: a processor configured to determine an index number of a second sign bit of the two sign bits, in which a value of "$2^M-2^N$" is less than a maximum value of the weights, in which the number "M" corresponds to the largest index number of the bits of the weights and the number "N" corresponds to the index number.

In some embodiments, the processor is further configured to encode the weights into test encoded weights with the second sign bit having a test index number, in which the processor is further configured to determine the test index number as the index number according to sparsity of the test encoded weights.

In some embodiments, the accumulator circuit comprises: recovery circuits, in which each of the recovery circuits comprises: an inverter configured to receive a first digital dot-product result of the digital dot-product results and generate an inversion of the first digital dot-product result; a first switch configured to turn on, in response to a first bit of the flag data having a value one, to transmit the inversion as an output of the recovery circuit; and a second switch configured to turn on, in response to the first bit of the flag data having a value zero, to transmit the first digital dot-product result as the output of the recovery circuit.

In some embodiments, the accumulator circuit further comprises: a shifter-and-adder circuit configured to shift and add the outputs of the recovery circuits to generate a multiply-and-accumulate result of the weights and the inputs.

Also disclosed is a method of operating a memory device. The method comprises: converting a magnitude bit of each of weights into a sign bit according to flag data to generate encoded weights, in which the flag data indicating an index number of the magnitude bit; performing compute-in-memory (CIM) operations to the encoded weights and inputs transmitted to a memory array storing the weights to generate CIM results; decoding the CIM results to generate decoded CIM results; and accumulating the decoded CIM results to generate a final result.

In some embodiments, the method of further comprises: converting a magnitude bit, having a test index number, of each of the weights into the sign bit to generate test encoded weights; and determining the test index number as the index number according to sparsity of the test encoded weights.

In some embodiments, the method further comprises: determining the index number according to a maximum value of the weights.

In some embodiments, the method further comprising: generating the flag data with a first bit being a bit one, in which the first bit corresponds to the index number.

In some embodiments, the decoding comprises: inverting a first CIM result of the CIM results according to a first bit of the flag data being a bit one to generate a first decoded CIM result of the decoded CIM results.

In some embodiments, each of the decoded CIM results corresponds to a column of the memory array, in which the accumulating comprises: performing a shift-and-add operation to each of the decoded CIM results according to a place of the column to generate the final result.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:

an encoder circuit configured to convert a plurality of weights into a plurality of encoded weights according to flag data, wherein one bit of each of the plurality of weights is a sign bit, wherein two bits of each of the plurality of encoded weights are sign bits, and bits between the two bits are magnitude bits, wherein the flag data indicates first and second index numbers of the two bits of each of the plurality of encoded weights;

a memory array comprising a plurality of memory cells, wherein the plurality of memory cells arranged in a same column are configured to store bits, of the plurality of encoded weights and the flag data, having the same index number, wherein the memory array is configured to perform a compute-in-memory (CIM) operation to the plurality of encoded weights and a plurality of inputs to generate a plurality of CIM results, wherein each of the plurality of CIM results corresponds to a column of the memory array; and an accumulator circuit configured to decode the plurality of CIM results according to the flag data to generate a plurality of decoded CIM results.

2. The memory device of claim 1, wherein the first index number of the two bits of each of the plurality of encoded weights is equal to an index number of the sign bit of each of the plurality of weights, wherein the encoder circuit is further configured to add a value of a first bit to a second bit of each of the plurality of weights to generate the plurality of encoded weights, wherein an index number of the first bit is equal to the second index number of the two bits of each of the plurality of encoded weights, wherein an index number of the second bit is greater than the second index number by one.

3. The memory device of claim 1, wherein the plurality of weights are in a two's complement format and the plurality of encoded weights are in a dual sign bit format that has two sign bits.

4. The memory device of claim 1, wherein index numbers of bits having values of one in the flag data correspond to index numbers of sign bits of the plurality of encoded weights.

5. The memory device of claim 1, wherein the memory array is further configured to generate a plurality of currents corresponding to the columns of the memory array according to the CIM operation, wherein the memory device further comprises:

an analog-to-digital converter configured to perform an analog-to-digital conversion to the plurality of currents to generate the plurality of CIM results.

6. The memory device of claim 1, further comprising a register circuit configured to retrieve the flag data from the memory array, wherein the accumulator circuit comprises:

a plurality of recovery circuits configured to decode the plurality of CIM results according to the flag data from the register circuit to generate the plurality of decoded CIM results; and a shifter-and-adder circuit configured to accumulate the plurality of decoded CIM results to generate a final result.

7. The memory device of claim 6, wherein each of the plurality of recovery circuits is configured to decode a corresponding CIM result of the plurality of CIM results according to a corresponding flag bit of the flag data, wherein the each of the plurality of recovery circuits comprises:

a first transmission gate configured to turn on, in response to the corresponding flag bit having a value of zero, to output the corresponding CIM result as a corresponding one of the plurality of decoded CIM results;

an inverter configured to invert the corresponding CIM result to generate an inversion; and a second transmission gate configured to turn on, in response to the corresponding flag bit having a value of one, to output the inversion as the corresponding one of the plurality of decoded CIM results.

8. The memory device of claim 1, wherein the second index number is set equal to a number "N", wherein a value of "2M−2N" is less than a maximum value of the plurality of weights, wherein the number "M" corresponds to the largest index number of bits of the plurality of weights.

9. A system, comprising:

an encoder circuit configured to convert a plurality of weights in form of two's complement into a plurality of encoded weights in form of dual sign bit according to flag data, wherein each of the plurality of encoded weights indicates a signed number, and each of the plurality of encoded weights has two sign bits, wherein a value of the signed number is a sum of products, wherein each of the products is (i) a bit of each of the plurality of encoded weights multiplied by "$-2^n$" when the bit is one of the two sign bits; or (ii) a bit of each of the plurality of encoded weights multiplied by "$2^n$" when the bit is a magnitude bit, wherein "n" is an index number of the bit;

a memory array comprising a plurality of memory cells, wherein a first row of the plurality of memory cells is configured to store the flag data and a plurality of second rows of the plurality of memory cells are configured to store the encoded weights, wherein the memory array is configured to perform dot-product operations to the plurality of encoded weights and a plurality of inputs on word lines of the memory array to generate a plurality of dot-product results on bit lines of the memory array;

an analog-to-digital converter circuit configured to convert the dot-product results into a plurality of digital dot-product results; and an accumulator circuit configured to decode the digital dot-product results according to the flag data to generate a plurality of decoded dot-product results.

10. The system of claim 9, the encoder circuit is further configured to convert a first bit of each of the plurality of weights into a sign bit and add the value of the first bit to a second bit of each of the plurality of weights, wherein an index number of the second bit is greater than an index number of the first bit by one.

11. The system of claim 9, wherein a first sign bit of the two sign bits is a most significant bit of each of the plurality of encoded weights, wherein the system further comprises:

a processor configured to determine an index number of a second sign bit of the two sign bits, wherein a value of "2M−2N" is less than a maximum value of the plurality of weights, wherein the number "M" corresponds to the largest index number of the bits of the plurality of weights and the number "N" corresponds to the index number.

12. The system of claim 11, wherein the processor is further configured to encode the plurality of weights into a plurality of test encoded weights with the second sign bit having a test index number, wherein the processor is further configured to determine the test index number as the index number according to sparsity of the plurality of test encoded weights.

13. The system of claim 9, wherein the accumulator circuit comprises:

a plurality of recovery circuits, wherein each of the plurality of recovery circuits comprises:

an inverter configured to receive a first digital dot-product result of the plurality of digital dot-product results and generate an inversion of the first digital dot-product result;

a first switch configured to turn on, in response to a first bit of the flag data having a value one, to transmit the inversion as an output of the recovery circuit; and a second switch configured to turn on, in response to the first bit of the flag data having a value zero, to transmit the first digital dot-product result as the output of the recovery circuit.

14. The system of claim 13, wherein the accumulator circuit further comprises:

a shifter-and-adder circuit configured to shift and add the outputs of the plurality of recovery circuits to generate a multiply-and-accumulate result of the plurality of weights and the inputs.

15. A method, comprising:

converting a first magnitude bit of each of a plurality of weights into a sign bit according to flag data, and adding a value of the first magnitude bit to a second magnitude bit of each of a plurality of weights to generate a plurality of encoded weights, wherein the flag data indicating an index number of the first magnitude bit, wherein an index number of the second magnitude bit is greater than the index number of the first magnitude bit by one, wherein each of the plurality of weights is in a two's complement format;

performing a plurality of compute-in-memory (CIM) operations to the plurality of encoded weights and a plurality of inputs transmitted to a memory array storing the plurality of weights to generate a plurality of CIM results;

decoding the CIM results to generate a plurality of decoded CIM results; and accumulating the decoded CIM results to generate a final result.

16. The method of claim 15, further comprising:

converting a magnitude bit, having a test index number, of each of the plurality of weights into the sign bit to generate a plurality of test encoded weights; and determining the test index number as the index number according to sparsity of the plurality of test encoded weights.

17. The method of claim 15, further comprising:

determining the index number according to a maximum value of the plurality of weights.

18. The method of claim 15, further comprising:

generating the flag data with a first bit being a bit one, wherein the first bit corresponds to the index number.

19. The method of claim 15, wherein the decoding comprises:

inverting a first CIM result of the plurality of CIM results according to a first bit of the flag data being a bit one to generate a first decoded CIM result of the plurality of decoded CIM results.

20. The method of claim 15, wherein each of the plurality of decoded CIM results corresponds to a column of the memory array, wherein the accumulating comprises:

performing a shift-and-add operation to each of the plurality of decoded CIM results according to a place of the column to generate the final result.

* * * * *